United States Patent
Horng et al.

(10) Patent No.: US 6,656,756 B2
(45) Date of Patent: Dec. 2, 2003

(54) TECHNIQUE FOR A SURFACE-EMITTING LASER DIODE WITH A METAL REFLECTOR

(75) Inventors: Ray-Hua Horng, Taoyuan Hsien (TW); Dong-Sing Wu, Taoyuan Hsien (TW); Wei-Chih Peng, Taoyuan Hsien (TW); Wen-Jeng Ho, Taoyuan Hsien (TW); Ying-Shun Huang, Taoyuan Hsien (TW)

(73) Assignee: Telecommunication Laboratories, Chunghwa Telecom Co., Ltd., Taoyuan Hsien (TW)

( * ) Notice: Subject to any disclaimer, the term of this patent is extended or adjusted under 35 U.S.C. 154(b) by 141 days.

(21) Appl. No.: 09/935,646

(22) Filed: Aug. 24, 2001

(65) Prior Publication Data

US 2003/0040133 A1 Feb. 27, 2003

(51) Int. Cl.$^7$ ................................. H01L 21/00
(52) U.S. Cl. ..................... 438/22; 438/47; 438/455
(58) Field of Search .................... 438/22, 29, 46, 438/47, 36, 37, 455, 458, 459, 977

(56) References Cited

U.S. PATENT DOCUMENTS

| 5,837,561 A | * | 11/1998 | Kish, Jr. et al. | 438/47 |
| 2002/0080836 A1 | * | 6/2002 | Hwang | 372/45 |
| 2003/0031221 A1 | * | 2/2003 | Wang et al. | 372/45 |

* cited by examiner

Primary Examiner—Tuan H. Nguyen
(74) Attorney, Agent, or Firm—Rosenberg, Klein & Lee

(57) ABSTRACT

The present invention is related to a method for fabricating a surface-emitting laser diode with a metal reflector. It is mainly the use of a combination of a metal reflector and wafer bonding technology to replace the traditional epiwafer process or high-temperature high-pressure wafer bonding technology in fabricating VCSEL Bragg Reflector. The metal reflector has high reflectance with its material selected to form ohmic contact with VCSEL material. Besides, the substrate for the metal reflector can be selected for cheap price and good heat dissipation. Further advantages include simple process, low production cost and good VCSEL characteristic etc.

10 Claims, 3 Drawing Sheets

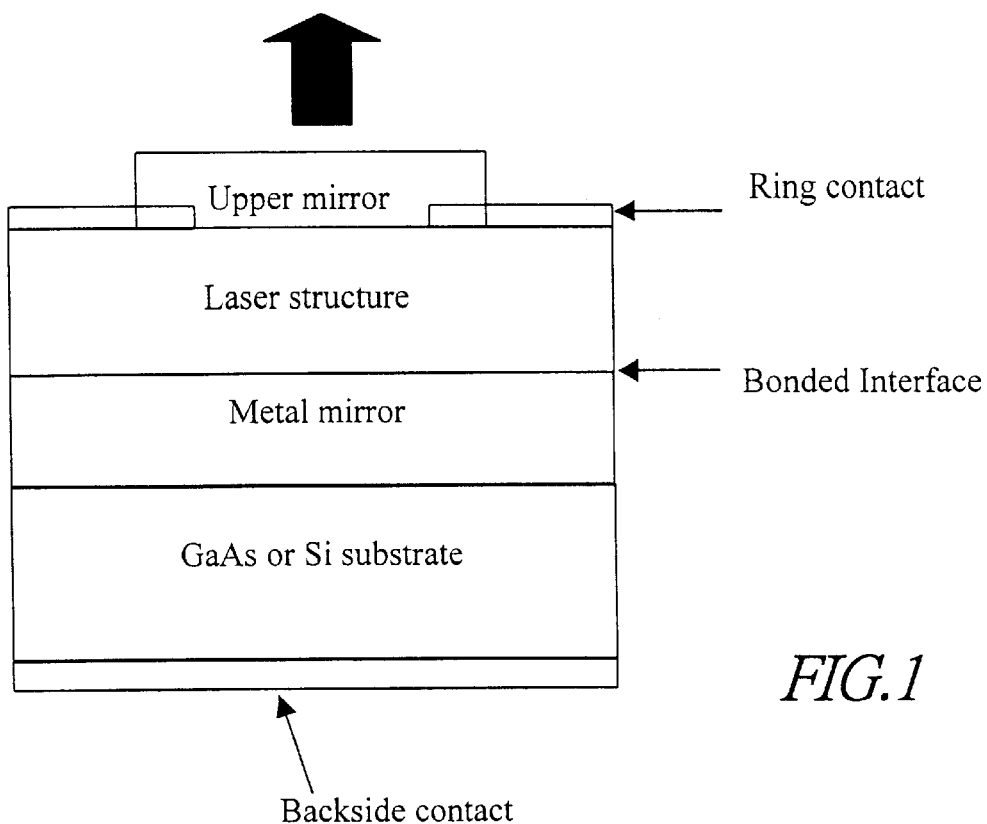
*FIG.1*
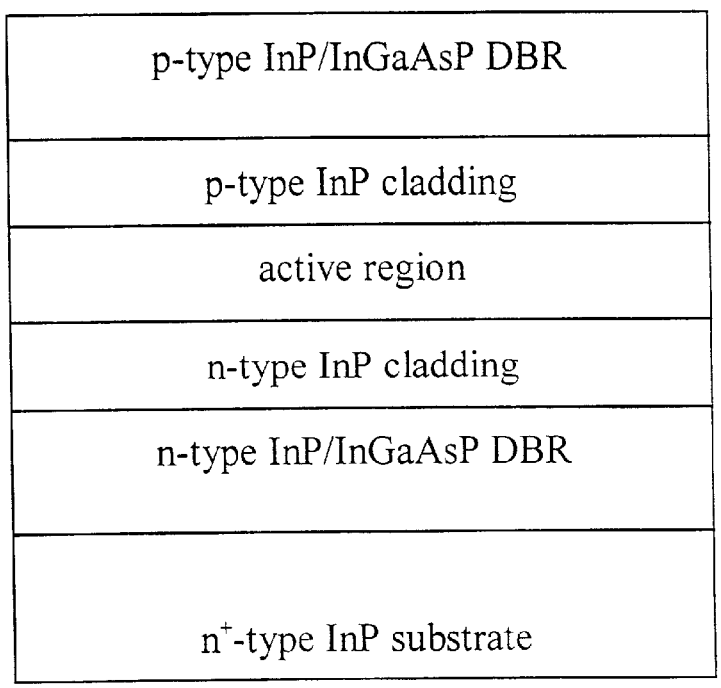
*PRIOR ART FIG.2*

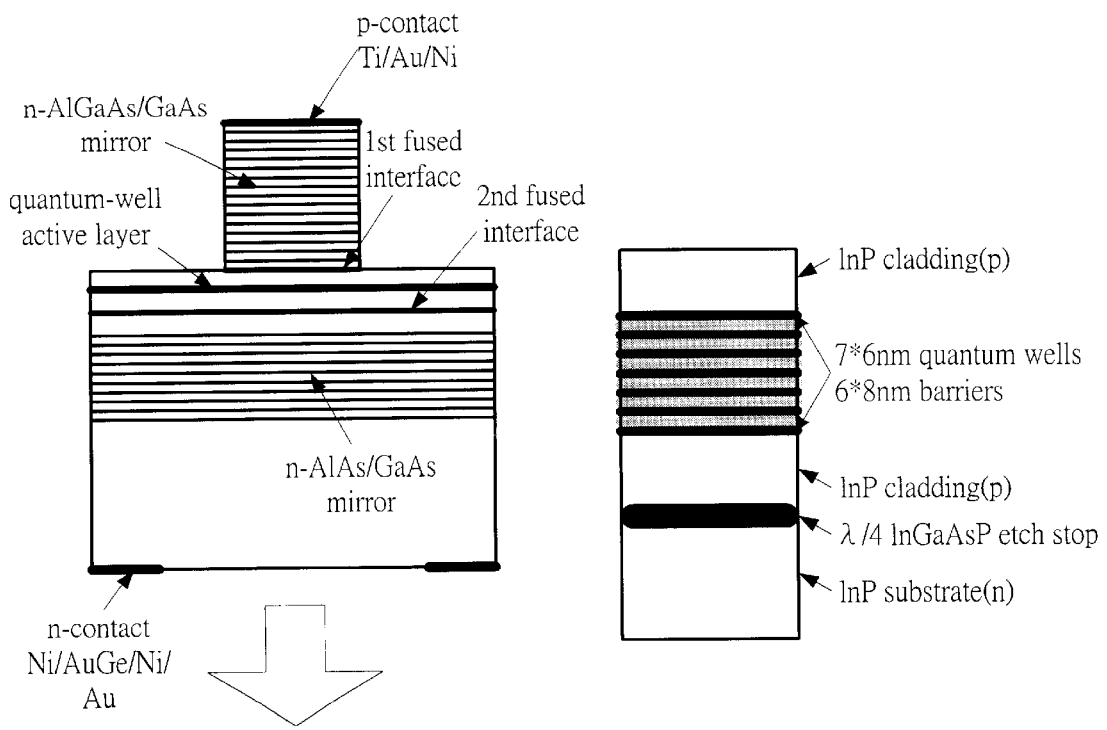
PRIOR ART
FIG.3a
PRIOR ART
FIG.3b
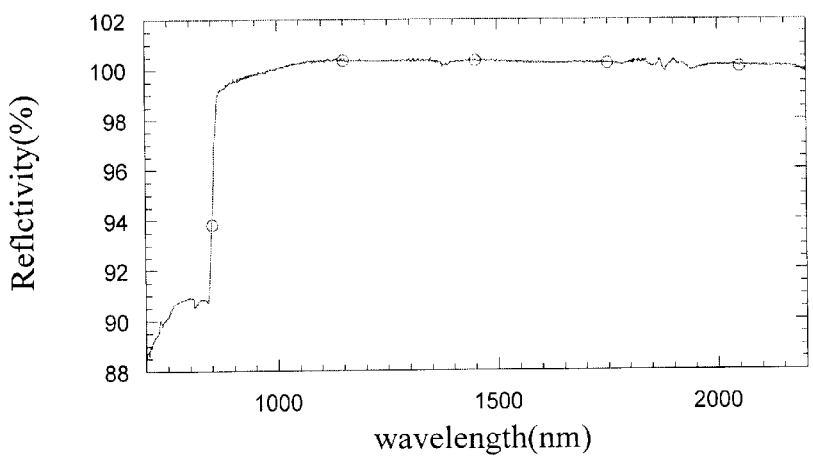
FIG.4

//ark:/67375/HBS-3X5V5M6L-6

TECHNIQUE FOR A SURFACE-EMITTING LASER DIODE WITH A METAL REFLECTOR

BACKGROUND OF THE INVENTION

1. Field of the Invention

The present invention is related to a process for fabricating a surface-emitting laser diode with a metal reflector. Especially, it is related to the use of a combination of a metal reflector and wafer bonding technology to replace traditional epiwafer process or high-temperature high-pressure wafer bonding technology in fabricating VCSEL Bragg Reflector.

2. Description of the Prior Art

Take 1.3 or 1.55 μm VCSEL as an example. Since traditional Surface-Emitting Laser diode has a kind of structure that the resonant cavity of the component is perpendicular to the epitaxial wafer layer with the reflective surface being composed of epiwafer layers or surface dielectric thin films and the laser is emitted from the front side, it is also called Vertical-Cavity Surface-Emitting Laser (VCSEL). The traditional technology continues to attract attention from worldwide research organizations since it was introduced to the world. In consideration of VCSEL components of various wavelengths, the development for VCSEL diodes of long wavelength (1.3 or 1.55 mm) still falls behind the development for those of short wavelength like VCSEL components of GaAs/AlGaAs series. It is found that the core of VCSEL is the resonant cavity, which uses Distributed Bragg Reflector (DBR) of epiwafer thin film that directly grows up and down the active region. Besides the structure and the characteristic of the active region, DBR reflectance and thermal conductivity also play critical roles in affecting the quality of VCSEL components. To reach such a high reflectivity, it relies on a proper match of the refractive index difference ($\Delta n$) and the number of reflector pairs composing DBR. For 1.3 or 1.55 mm VCSEL components, if lattice match is considered, only the active layer of InGaAsP/InP reflector grown on InP series can be selected. But InGaAsP/InP reflector pairs not only have poor thermal conductivity but also small refractive index difference $\Delta n$ (compared to Gas/AlAs Bragg mirror), so a significant number of reflector pairs are required to increase reflectivity. Nevertheless, this gives rise to another problem that a tough challenge happens to the people carrying out epitaxial growth and a serious setback for production cost and yield also occurs because more than a thousand times of changes in molecular beams (MBE) or gas sources (MOCVD) and a very long growth period (4 to 8 hours) is required along with maintaining a growth error of less than 1% in such a complicated process of epitaxial structure growth. If a metal reflector of high reflectivity is made on a proper substrate (good heat dissipation and matched thermal expansion coefficients and active layers)with the use of wafer bonding technology to form an integrated laser active layer, the coated film quality of metal reflector will become easier to control than that of DBR epiwafer, and the cost will be reduced so that high quality VCSEL is easier to be produced.

As shown by the above description, the traditional technology still has many shortcomings, so it needs immediate improvement.

Seeing that the traditional technology mentioned above gives rise to many shortcomings, the inventor is eager to seek improvements and innovations. After many years of dedication to research and development, the inventor successfully invented a method for fabricating a surface-emitting laser diode with a metal reflector.

SUMMARY OF THE INVENTION

The objective of the present invention is to provide a method for fabricating a surface-emitting laser diode with a metal reflector, which uses wafer fusion technology to bond a metal layer of high reflectivity to 1.3 or 1.55 mm VCSEL structure to replace traditional lattice matched InGaAsP/InP DBR or uses crystal lattice of wafer fusion technology and 1.3 or 1.55 mm VCSEL unmatched GaAs/AlGaAs to form DBR. Another objective of the present invention is to provide a method for fabricating a surface-emitting laser diode with a metal reflector, which uses a metal reflector in accordance with wafer bonding technology so that the advantages include simple process, low production cost and good VCSEL characteristics etc.

The methods to achieve the above-mentioned objectives of fabricating a surface-emitting laser diode with a metal reflector include: a substrate of metal reflector structure, a substrate of epiwafer film with surface-emitting laser structure, wafer bonding technology and epiwafer film removal technology. Wafer bonding is used to combine the epitaxial VCSEL wafer of active region and the wafer of top and bottom reflectors, followed by high-temperature, high-pressure and substrate removal procedures to form VCSEL. The metal reflector structure is made of materials like Au, AuBe, AuZn, AuGeNi, AuGe, Ni, Pt, Ti, TiN, Ta, TaN and Pd in layer of a single kind of metal or in multiple layers of metals. Surface-emitting laser diode can emit laser of wavelengths at 850, 1300 and 1500 nm. The laser diode can be produced by metal organic chemical vapor deposition or molecular beam epitaxial growth.

BRIEF DESCRIPTION OF THE DRAWINGS

The drawings disclose an illustrative embodiment of the present invention that serves to exemplify the various advantages and objects hereof, and are as follows:

FIG. 1 illustrates the structural diagram that shows wafer bonding technology is used to bond a metal layer of high-reflectivity to VCSEL;

FIG. 2 illustrates the structural diagram of traditional VCSEL;

FIG. 3a is the illustrative diagram that shows traditional wafer bonding technology is used to combine the epitaxial VCSEL wafer of active region and the wafer of top and bottom reflectors, followed by high-temperature, high-pressure and substrate removal procedures to form VCSEL;

FIG. 3b is the structural diagram of the active region for the VCSEL in FIG. 3a;

FIG. 4 is the reflectivity characteristic plot for Au/AuBe metal used in a surface-emitting laser diode with a metal reflector.

Annotation for Major Components

Figure 5:
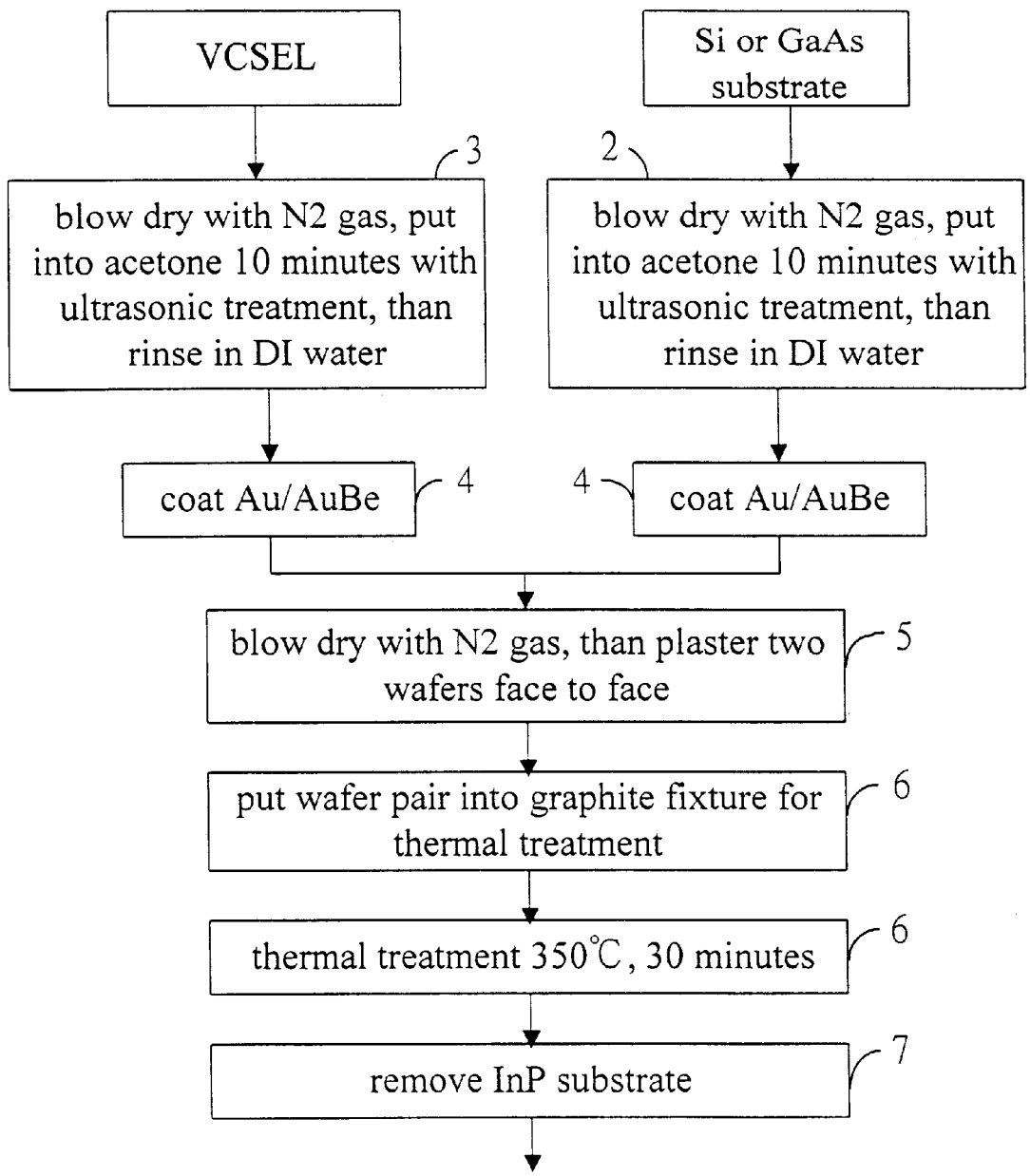
FIG. 5 is the flow diagram that shows the VCSEL wafer bonding process for a surface-emitting laser diode with a metal reflector.

1 Metal layer
2 Place it in acetone, followed by applying ultrasonic vibration for about 10 minutes, and then rinse it by deionized water
3 Place it in acetone, followed by applying supersonic vibration for about 10 minutes, and then rinse it by deionized water 4 Coat it with Au/AuBe
5 Bond the two wafers face to face
6 Apply heat treatment
7 Remove InP Substrate

DETAILED DESCRIPTION OF THE PREFERRED EMBODIMENT

The present invention is to use wafer bonding technology to bond a metal layer 1 of high reflectance to 1.3 or 1.55 mm VCSEL structure, as shown in FIG. 1, which can replace DBR formed in InGaAsP/InP DBR of traditional lattice matched epiwafer of wafer bonding technology and unmatched GaAs/AlGaAs for 1.3 or 1.55 mm VCSEL.

Presently, there are two methods to form the resonant cavity in VCSEL structure. One is to use epitaxial growth to form the bottom reflector of the resonant cavity at the active region of epiwafer VCSEL, as shown in FIG. 2. The other is to use wafer bonding technology to bond each individual epitaxial VCSEL active wafer to its wafer or bottom reflector, followed by high-temperature, high-pressure and substrate removal procedures to form VCSEL (as shown in FIGS. 3a and 3b). Both methods use Distributed Bragg Reflector (DBR)in two layers of materials of different refractive indices with proper lasing wavelength to design the thickness and pair number for resonant cavity. Usually, the more the pair number is, the higher the reflectance is and the larger the epitaxial growth cost is and the harder the process is controlled. Besides, if wafer bonding is used to make VCSEL, the wafer surface will need proper patterns to assure successful bonding through high-temperature and high-pressure procedures. These kinds of treatment not only reduce the available surface area on wafer, but also cause adverse influence on laser characteristic.

The feature of the present invention is the use of a metal reflector of high reflectance to replace DBR. The requirements for the metal reflector include (1) after VCSEL is through all the post procedures, the metal can still maintain a very high reflectance (as shown in FIG. 4); (2)the metal can form ohmic contact in n-type or p-type with VCSEL (usually p-type ohmic contact); (3)the metal can be used as the bonding layer between the metal reflector and the substrate of laser active layer, which is bonded together by wafer bonding technology. Hence the present invention does not need epitaxial growth of DBR, which greatly reduces the cost of VCSEL. The present invention uses low temperature (<450° C.)and short time (<1 hour) for bonding, so no adverse influence is made to the laser diode structure. Besides, since the reflector is made of metal, its material selection can be made of close thermal expansion coefficient to VCSEL epiwafer film and good heat dissipation (for example, if VCSEL has wavelength of 1.3 or 1.55 μm, the substrate for epitaxial growth can be InP and the substrate for the metal reflector can be GaAs or Si), which gives very positive influence on cost or laser characteristic.

As the wavelength of 1.3 or 1.55 μm shown previously, the present invention can first coat a Au/AuBe reflector on silicone substrate (or GaAs), followed by bonding with the InP substrate of VCSEL structure at a low temperature for a short time, which flow diagram is shown in FIG. 5.

The flow process includes:
Dry Si or GaAs by blowing $N_2$. Place it in acetone. Apply ultrasonic vibration for about 10 minutes. Rinse it 2 by deionized water;
Dry VCSEL by blowing $N_2$. Place it in acetone. Apply ultrasonic vibration for about 10 minutes. Rinse it 3 by deionized water;
Coat the above two wafers with Au/AuBe 4;
Dry it by blowing N2. Bond the two wafers face to face 5;
Place the wafer pair in polishing fixture for heat treatment 6;
After heat treatment is completed, remove InP Substrate 7.

Wherein, the temperature of 350° C. and the time of 30 minutes used in the heat treatment stage has no adverse effect on the laser diode structure. Instead, the product has the similar bonding characteristic to those through low-temperature and short time treatment.

The present invention provides a method for fabricating a surface-emitting laser diode with a metal reflector. When compared to the above-mentioned other traditional methods, the present invention has the following advantages:

The metal can be used in a simple and low-cost thermal evaporation deposition system, which can achieve the following three functions:
1. high reflectance
2. forming ohmic contact with p-type InP
3. use as the bonding layer between the main substrate (Si or GaAs) and epiwafer substrate.

Many changes and modifications in the above-described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A method of fabricating a surface-emitting laser diode with a metal reflector comprising the steps of:
    (a) establishing a temporary substrate for epitaxial growth;
    (b) epitaxially growing in aligned consecutive order an etching stop layer, an n-DBR layer, an n-cladding layer, an active layer, and a p-cladding layer on said temporary substrate;
    (c) establishing a permanent substrate;
    (d) coating said permanent substrate and said p-cladding layer with first and second metallic layers, respectively;
    (e) bonding said first and second metallic layers together;
    (f) removing said temporary substrate;
    (g) removing said etching stop layer to form an epitaxial laser structure; and,
    (h) forming a pair of electrodes on said epitaxial laser structure.

2. The method of fabricating a surface-emitting laser diode with a metal reflector as recited in claim 1, wherein step (b) is followed by epitaxial growth of an ohmic contact layer on said temporary substrate.

3. The method of fabricating a surface-emitting laser diode with a metal reflector as recited in claim 1, wherein said permanent substrate is a mechanically supporting substrate.

4. The method of fabricating a surface-emitting laser diode with a metal reflector as recited in claim 1, wherein step (b) is followed by a step of heat treatment.

5. The method of fabricating a surface-emitting laser diode with a metal reflector as recited in claim 1, wherein step (f) is followed by a step of chemical etching of the permanent substrate to remove epitaxial layers.

6. The method of fabricating a surface-emitting laser diode with a metal reflector as recited in claim 1, wherein the removal of said temporary substrate of step (f) is effected through mechanical polishing and chemical etching.

7. A method of fabricating a surface-emitting laser diode with a metal reflector comprising the steps of:

(a) establishing a first temporary substrate for epitaxial growth;

(b) epitaxially growing in aligned consecutive order an etching stop layer, an n-cladding layer, an active layer, a p-cladding layer, and a p-DBR layer on said first temporary substrate to form a VCSEL structure;

(c) forming an electrode pattern on said VCSEL structure;

(d) establishing a second temporary substrate;

(e) bonding said second temporary substrate to said VCSEL structure to form an epitaxial laser structure;

(f) removing said first temporary substrate and said etching stop layer;

(g) establishing a permanent substrate;

(h) coating said permanent substrate and said epitaxial laser structure with first and second metallic layers, respectively;

(i) bonding said first and second metallic layers together; and, (j) removing said second temporary substrate.

8. The method of fabricating a surface-emitting laser diode with a metal reflector as recited in claim 7, wherein said removal of said second temporary substrate in step (j) is effected through application of heat.

9. The method of fabricating a surface-emitting laser diode with a metal reflector as recited in claim 7, wherein said removal of said second temporary substrate of step (j) is effected through application of an organic solvent.

10. The method of fabricating a surface-emitting laser diode with a metal reflector as recited in claim 7, wherein said second temporary substrate of step (d) is formed of a glass.

* * * * *